(12) United States Patent
Huang

(10) Patent No.: US 6,706,234 B2
(45) Date of Patent: Mar. 16, 2004

(54) DIRECT WRITE METHOD FOR POLARIZED MATERIALS

(75) Inventor: Wen-Chiang Huang, Auburn, AL (US)

(73) Assignee: Nanotek Instruments, Inc., Fargo, ND (US)

(*) Notice: Subject to any disclaimer, the term of this patent is extended or adjusted under 35 U.S.C. 154(b) by 336 days.

(21) Appl. No.: 09/924,135

(22) Filed: Aug. 8, 2001

(65) Prior Publication Data
US 2003/0032214 A1 Feb. 13, 2003

(51) Int. Cl.[7] .......................... B29C 35/08; B29C 41/02; H05B 6/00
(52) U.S. Cl. ........................... 264/435; 264/308
(58) Field of Search ................ 264/308, 401, 264/435, 497

(56) References Cited

U.S. PATENT DOCUMENTS

| 4,526,807 A | 7/1985 | Auerbach |
| 4,830,795 A | 5/1989 | Scheinbein et al. |
| 4,863,648 A | 9/1989 | Scheinbein et al. |
| 4,916,115 A | 4/1990 | Mantese et al. |
| 4,948,623 A | 8/1990 | Beach et al. |
| 5,132,248 A | 7/1992 | Drummond et al. |
| 5,378,508 A | 1/1995 | Castro et al. |
| 5,561,030 A | 10/1996 | Holdcroft et al. |
| 5,846,615 A | 12/1998 | Sharma et al. |
| 5,894,038 A | 4/1999 | Sharma et al. |
| 6,120,588 A | 9/2000 | Jacobson et al. |
| 6,177,921 B1 | 1/2001 | Comiskey et al. |
| 6,200,508 B1 | 3/2001 | Jacobson et al. |
| 6,251,488 B1 | 6/2001 | Miller et al. |
| 6,252,564 B1 | 6/2001 | Albert et al. |

Primary Examiner—Leo B. Tentoni

(57) ABSTRACT

A direct-write method for depositing a polarized material of a predetermined computer-aided pattern onto a target surface, the method including the following steps: (1) forming a solution of a material capable of being polarized using a polarization solvent which can be removed by evaporation to provide a polarized material; (2) operating dispensing devices to dispense and deposit the solution onto the target surface substantially point by point and at least partially removing the solvent from the deposited solution to form a thin layer of substantially solidified material of the predetermined pattern; and (3) during the solvent-removing step, operating a high DC voltage for poling the deposited solution to achieve polarization in the material. The invention also provides a freeform fabrication method for building a multi-layer device, such as a micro-electro-mechanical system (MEMS), that exhibits piezoelectric or pyroelectric properties.

20 Claims, 2 Drawing Sheets

DIRECT WRITE METHOD FOR POLARIZED MATERIALS

FIELD OF INVENTION

This invention relates to a method for directly depositing a polarized material with a net polarization onto a substrate. This invention also provides a freeform fabrication method for making a multi-layered device that contains a polarized material which is essentially stable up to its crystal melting point (if the polarized material is crystalline) or its softening point (if the material is non-crystalline). The polarized material is substantially free of mechanically-induced orientation and has mechanical and electromechanical properties isotropic in a plane perpendicular to the poling field direction. The method is particularly useful for making a micro-electro-mechanical system (MEMS) featuring a polymeric material element with piezoelectric and pyroelectric properties.

BACKGROUND

Recent advancements in the microelectronics industry have allowed integrated circuit (IC) chip manufacturer to achieve a very high packing density within a single IC chip. However, the electronics packaging industry has not seen the same degree of size reduction as in the IC industry. One reason for this difference lies in the need to utilize discrete active and passive devices on circuit boards as well as electrical interconnections to achieve fully functioning IC devices. Due to the requirement of placing each of the discrete devices onto the circuit board, various physical constrains dictate the size that the circuit board must maintain.

In order to miniaturize and integrate traditional microelectronic elements and functionally responsive devices (e.g., photonic and piezoelectric devices) together, a new sector of microelectronics industry, known as micro-electro-mechanical systems (MEMS), has started to emerge. MEMS are finding ever broadening applications, including complex sensor and actuator arrays that go into devices such as air bag activators and other miniature smart material devices. Many of the processes used to fabricate MEMS devices still depend on expensive and complicated semiconductor equipment and facilities, nevertheless. These processes are largely limited to silicon-based materials. Furthermore, some of the processing temperatures for MEMS fabrication are not compatible with electronic devices. Due to the ease of processing (including lower processing temperatures), lower cost and good mechanical integrity, polymers have been considered to be ideal materials for MEMS and electronics applications.

In order to develop polymer-based MEMS, one must develop methods for depositing layers of materials comprising functionally active polymers (e.g., piezoelectric, pyroelectric, photonic, mechano-chemical, thermoelectric, etc.) and passive polymers (conducting, semiconducting, insulating, dielectric, etc.) onto one another. Piezoelectric and pyroelectric materials are particularly useful elements in the MEMS devices for sensor and actuator applications. Hence, it is highly desirable to develop a direct-write method for directly depositing a piezoelectric or pyroelectric polymer onto a solid substrate.

Certain materials are capable of being polarized when subjected to mechanical or electrical stresses. For instance, poly (vinylidene fluoride) (PVDF) can be polarized by stretching a sheet of PVDF at a temperature of approximately 70° C. to at least three times its length, and subjecting the stretched sheet to a DC field of at least 1 MV/cm. PVDF has been a preferred polymeric material for polarization, since it has been found to have a high capability of polarization response, thereby providing high piezoelectric or pyroelectric properties or highly desired optical properties. Subjecting such a stretched film to a DC field applied in a direction perpendicular to the plane of the stretched film causes an orientation of the molecular dipoles of the materials. In the case of PVDF, the fluoro groups have a negative charge and the hydrogen atoms attached to the other carbon of the vinylidene fluoride unit of the polymer have a positive charge. Vinylidene fluoride units in a PVDF film are known to exist in at least two different crystalline forms: (1) a planar zigzag polar form or trans form (beta form or Form 1) and nonpolar and nonplanar T-G-T-G' form (alpha form or Form 2) in where T denotes trans configuration and G and G' denote the two types of gauche forms. The desired increase in Form 1 has been realized by subjecting PVDF films to stretching and subsequently subjecting the stretched films to high DC fields over extended periods of time at high temperatures. Such a treatment with a DC field is referred to as poling. The polarized material is cooled after poling for purposes of retaining the polarization. The existence of a high content of Form 1 is essential to achieving the highest amount of desired polarization properties required of good piezoelectric and pyroelectric responses.

Polarized PVDF materials are commonly used in making transducers, which utilize the piezoelectric or pyroelectric or other polarization properties of such polarized materials. It is well-known that various other polymers, such as polyvinylchloride (PVC), polyvinylfluoride (PVF), vinylidene fluoride copolymers, and many other polymers have the capability of being polarized as do a large number of ceramic materials such as lead zirconate titanate (PZT).

Mechanical stretching in the film direction causes an unequal (or anisotropic) strength in the stretching or axial direction ($X-X_1$) as compared to the transverse direction ($Y-Y_1$). This is an undesirable attribute of the piezoelectric polymers. Instead, it is desired to provide polymers which are substantially free of such mechanically induced orientation and which have a polarization that is stable up to the crystal melting point (if the polarized material is crystalline) or material softening point (if non-crystalline). Furthermore, the need to mechanically stretch a polymer film is not compatible with traditional microelectronics fabrication processes. In order to fabricate a MEMS device that contains a piezoelectric polymer element, it is essential to develop a direct-write method for directly depositing polarized or polarizable polymers to a solid substrate without post-deposition stretching. Scheinbeim, et al. (U.S. Pat. No. 4,830,795, May 16, 1989 and No. 4,863,648, Sep. 5, 1989) disclosed a solvent polarization method to produce a thick film of a simple geometry; however, no method has been proposed that allows direct deposition of a thin film of a polarizable material with a predetermined pattern on a solid substrate. It is desired to integrate such a direct-write method with other microelectronic fabrication methods or solid freeform fabrication methods to fabricate a multi-layer device on a point-by-point and layer-by-layer basis.

SUMMARY OF INVENTION

A direct-write method has been developed by which highly polarized materials in the form of a patterned thin film can be deposited onto a solid substrate. The materials deposited are substantially free of mechanically induced orientation and their polarization is essentially stable up to about the crystal melting point of the polarized material in the case of a crystalline material or up to about the softening point (glass transition temperature) of the polarized material in the case of non-crystalline polarized material. The method includes dissolving a material to be polarized in a solvent or solvents for that material to form a solution. The solution is then dispensed in the form of fine discrete droplets or a continuous strand in a fluent state and deposited onto a target surface in an essentially point-by-point and layer-by-layer fashion. The target may be a semiconducting substrate or a conducting electrode supported on the surface of a substrate. The solvent is selected which is adapted to the polarization of the material and which can be removed to the extent desired during the course of the polarization. A high electric field is applied to polarize the deposited material while the solvent is being removed. The temperature employed will be one at which polarization effectively occurs, normally at an elevated temperature below which substantial dielectric breakdown could occur. The DC field employed in the polarization will be selected which provides the desired polarization.

Also provided by this invention is a freeform fabrication method by which a multi-layer device containing a polarized material can be produced point by point and layer by layer. Individual layers may comprise a patterned thin film of a polarized material and/or other electronically active or passive materials such as a conductor, resistor, semi-conductor, capacitor, inductor, superconductor, diode, transistor, light-emitting element, light-sensing element, solar cell element, sensor, actuator, semiconductor logic element, electro-optic logic element, spin material, magnetic material, thermoelectric element, electromagnetic wave emission, transmission or reception element, electronically addressable ink, or a combination thereof. The polarizable material presently preferred is poly (vinylidene fluoride) or certain copolymers of vinylidene fluoride. A functionally responsive device such as a micro-electro-mechanical system (MEMS) can be fabricated point by point and layer by layer under the control of a computer in accordance with a computer-aided design (CAD) of this device.

DETAILED DESCRIPTION OF THE INVENTION AND THE PREFERRED EMBODIMENTS

The method begins by first dissolving the material to be polarized in the required amount of a suitable solvent or solvents to form a solution. In the case of poly(vinylidene fluoride) (PVDF), a solvent such as tricresylphosphate can be used. Approximately 5% by weight of PVDF can be dissolved in 95% of tricresylphosphate or another polarization solvent for making the solution for deposition. The mixture may be heated to about 180° C.–190° C. to accelerate the dissolution step. A capacitor grade PVDF available from Kureha Kagoku Kogko Kabishiki Kaisha and VDF copolymer (Kynar) supplied by Pennwalt Corp. were found to be suitable.

Once a solution is prepared, it is preferred to reduce the solvent content in the solution prior to being dispensed from a dispensing device onto a target surface for polarization. For example, in the case of PVDF/tricresylphosphate solution, the solvent content can be reduced from 95% to 50% or below such as to 25% or lower provided that the PVDF remains in solution.

Figure 1:
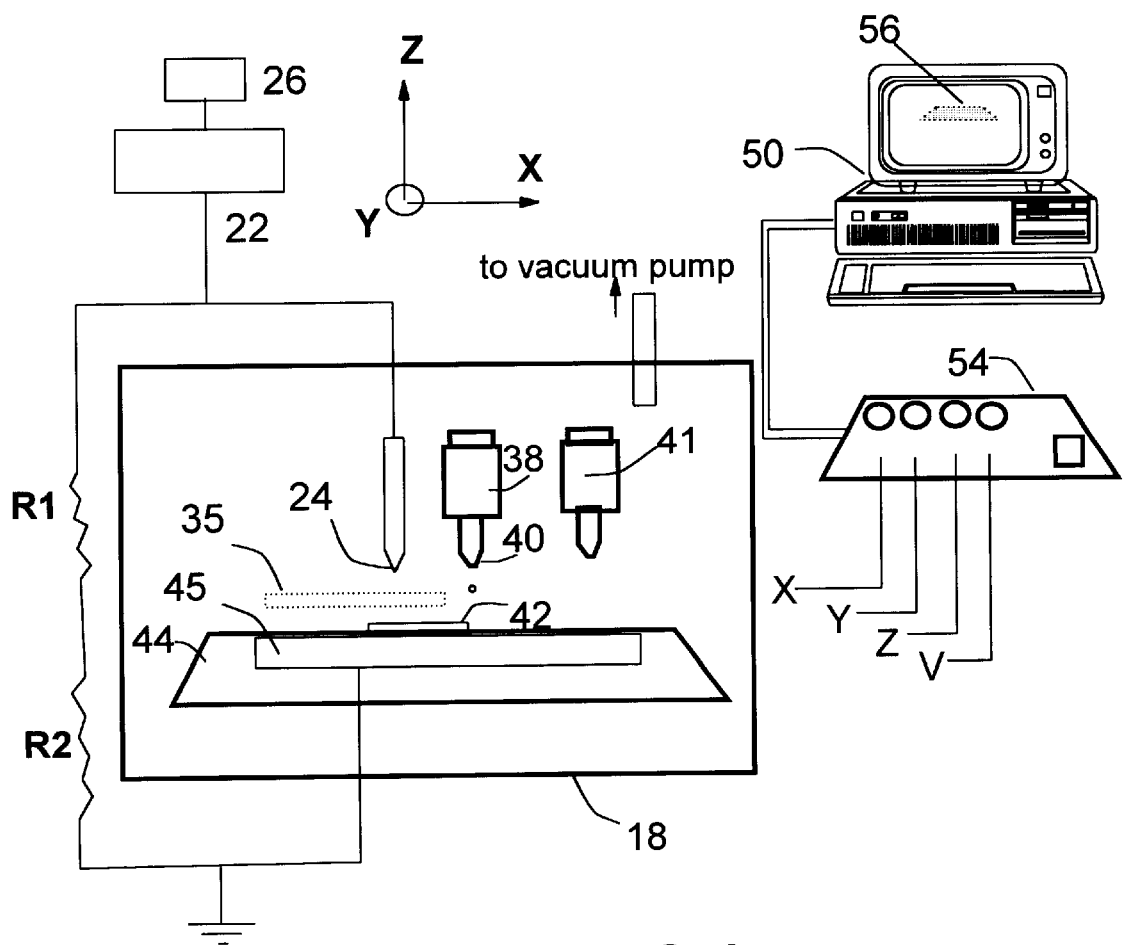
FIG. 1 is a schematic representation of an apparatus used to deposit a patterned thin film of a polarizable material and to provide the DC field for the polarization of the material when the solvent is being removed by evaporation during poling.

As shown in FIG. 1, the solution of PVDF with the reduced solvent content can be introduced into a dispensing device 38 which has at least a nozzle 40 through which the solution may be discharged, continuously or intermittently on demand, into the form of discrete fine droplets or a thin strand. The dispensed solution is deposited onto a target surface 44 essentially point by point to form a thin film 42 of a predetermined geometric pattern. Both the dispensing device 38 and the target surface 44 are preferably placed into a suitable vacuum oven 18 which is equipped with an appropriate DC source 22 controlled by a DC voltage ramping unit 26. The PVDF solution deposited is placed between two suitable electrodes, or a corona tip 24 and an electrode 45 for poling. Polished copper plates or deposited copper thin layers can be used as the electrodes. The electric field is provided through the high voltage DC source after the solution is deposited and when part of the solvent is being removed. Temperature of the deposited material is adjusted as desired. It is advantageous to use a temperature that provides a high rate of solvent removal and a high rate of polarization without incurring substantial dielectric breakdown of the material being polarized.

A wide range of dispensing devices can be selected for use in practicing the present method. A dispensing device may contain an inkjet printhead, liquid droplet generator, extrusion device, gear pump, air pressure pump, positive displacement pump, screw-driven pump, syringe pump, fused deposition modeling nozzle, or a combination thereof. These devices are well known in the art of liquid dispensing, rapid prototyping, and inkjet printing. There are many commercially available inkjet print heads that are capable of dispensing the material compositions in the presently invented method. Examples include those supplied by the Lee Company (Westbrook, Conn., USA), Tektronix (Beavorton, Oreg., USA), and Spectra, Inc. (Keene, N.H., USA). A multiplicity of dispensing devices (having a plurality of nozzles or nozzle orifices) may be used to deposit different material compositions sequentially or concurrently. FIG. 1 only shows two nozzles, 38 and 41, but any number of nozzles may be used. At least one of the nozzles or nozzle orifices is used to deposit the polarizable solution while at least another nozzle or orifice may be used to deposit other materials in the same layer, or different layers if a multilayer device is being made. These other materials may contain a composition selected from the group consisting of a conductor, resistor, semi-conductor, capacitor, inductor, superconductor, diode, transistor, light-emitting element, light-sensing element, solar cell element, sensor, actuator, semiconductor logic element, electro-optic logic element, spin material, magnetic material, thermoelectric element, electromagnetic wave emission, transmission or reception element, electronically addressable ink, or a combination thereof. In order to print a MEMS device, several of these materials will be deposited also point by point and layer by layer.

Generally speaking, printing of conductors and resistors is well known in the art of circuit board manufacture. For instance, Drummond, et al. (U.S. Pat. No. 5,132,248, Jul. 21, 1992) provide a direct-write method for depositing a metal or dielectric onto a substrate such as a semiconductor. The material is deposited by providing a colloidal suspension of the material and directly writing the suspension onto the substrate surface by inkjet printing techniques. The deposited material is then resolved into a desired pattern by using laser annealing. Castro, et al. (U.S. Pat. No. 5,378,508, Jan. 3, 1995) provide a laser direct write method for depositing metal on a dielectric substrate from a mixture of a salt and amine or amide compound. Auerbach (U.S. Pat. No. 4,526, 807, Jul. 2, 1985) proposes a method for deposition on a substrate of elemental metals and metalloids in the form of conducting lines, spots and the like. The method involves (a) preparing a solution or dispersion of a reducible metal or metalloid compound in an oxidizable organic matrix such as a polyamic acid or polyimide, (b) coating the substrate with this solution or dispersion, and (c) contacting the coated substrate with a laser beam. Direct deposition of gold and palladium was studied by Sharma, et al. (U.S. Pat. No. 5,846,615, Dec. 8, 1998 and No. 5,894,038, Apr. 13, 1999). Chemical vapor deposition of copper, silver, and gold from a cyclopentadienyl/metal complex was achieved by Beach, et al. (U.S. Pat. No. 4,948,623, Aug. 14, 1990). Holdcraft, et al. (U.S. Pat. No. 5,561,030, Oct. 1, 1996) disclose a method for fabricating electronically conducting polymer patterns. Selective laser pyrolysis was utilized by Mantese, et al. (U.S. Pat. No. 4,916,115, Apr. 10, 1990) to fabricate thin-film patterned superconductors.

Inkjet printing was adapted by Jacobson (U.S. Pat. No. 6,120,588, Sep. 19, 2000) for depositing electronic inks, conductors, insulators, resistors, semi-conductive materials, magnetic materials, spin materials, piezoelectric materials, opto-electronic, thermoelectric or radio frequency materials. Fluid jetting, electro-plating, and electrodeless plating techniques were used by Jacobsen, et al. (U.S. Pat. No. 6,200, 508, Mar. 13, 2001) to deposit electromechanical devices. Printable electronic inks are used by Comiskey and Albert, et al. (e.g., U.S. Pat. No. 6,177,921, Jan. 23, 2001 and No. 6,252,564, Jun. 26, 2001) for making flexible displays. Miller, et al. (U.S. Pat. No. 6,251,488, Jun. 26, 2001) discloses a method that combines a powder spray process with in-flight laser treatment in order to produce direct write electronic components. Any of the above-cited methods can be used in combination with the presently invented method to fabricate a microelectronic or MENS device.

As shown in FIG. 1, a conventional corona discharge apparatus is used to provide the required electric field, in which a grid 35 is placed above the deposited solution of material to be polarized. The solvent content can be reduced during the polarization by passing a flow of a suitable gas (e.g., nitrogen) over the surface of the deposited film. Alternatively, a vacuum pump may be utilized to pump out the vaporized solvent continuously.

A proper intensity of the electric field used can be selected to provide efficient polarization. However, it is preferably kept below the range at which substantial dielectric breakdown of the material being polarized occurs. In the case of PVDF, an electrical field of 250 KV/cm was found to be satisfactory to pole a PVDF solution having a 25 percent solvent content. The electrical field could be increased to 500 KV/cm as the solvent content decreased and increased further to 750 KV/cm when the solvent content is further reduced to about 15 percent. The further increase of the electrical field beyond 750 KV/cm at 15 percent solvent can result in some dielectric breakdown, for example, in the range of about 800 to about 1000 KV/cm. The above conditions are similar to those used by Scheinbeim, et al. (U.S. Pat. No. 4,830,795, May 16, 1989 and No. 4,863,648, Sep. 5, 1989).

The temperature at which the polarization process is carried out depends upon the desired rate at which polarization occurs, the material used, the solvent used, the equipment available for polarization, the desired level of solvent wished to be retained in the final polarization material and other factors. A poling temperature of in the range of 60°–of 90° C. was found to give satisfactory results. The poling temperature should be maintained lower than the boiling point of the solvent under the conditions used.

A wide range of materials can be used in practicing this invention. Although a preferred material is poly(vinylidene fluoride), copolymers of vinylidene fluoride are also useful materials. These include vinylidene fluoride copolymers with vinyl fluoride, trifluoroethylene, tetrafluoroethylene, vinyl chloride, methylmethacrylate, and others. The vinylidene fluoride content can vary in the range of from about 30% by weight to about 95% by weight. Other polymers which can be used are polyvinylchloride, polymethylacrylate, polymethylmethacrylate, vinylidene cyanide/vinyl acetate copolymers, vinylidene cyanide/vinyl benzoate copolymers, vinylidene cyanide/isobutylene copolymers, vinylidene cyanide/methyl methacrylate copolymers, polyvinylfluoride, polyacrylonitrile, polycarbonate, and nylons such as Nylon-7 and Nylon-11, natural polymers such as cellulose and proteins, synthetic polymers such as derivatives of cellulose, such as esters and ethers, poly (γ-methyl-L-glutamate), and the like. In addition, polarizable materials which are soluble ceramic materials and capable of forming polar crystals or glasses can be used together with an appropriate polarization solvent for a particular soluble ceramic material used.

A variety of organic solvents can be used depending upon the material used in the polarization, cost and safety consideration, equipment used, and other factors. Tricresylphosphate has been found to be a suitable solvent for PVDF and many copolymers of vinylidene fluoride. Dibutyl phthalate can also be used as the solvent for these vinylidene polymers. For nylon-7 and nylon-11, 2-ethyl-1,3-hexanediol can be used.

As an example, a material composition was prepared by dissolving 5% by weight of Kureha capacitor grade PVDF film in 95% of tricresylphosphate at 180° C. The solution was placed in a vacuum chamber, which was maintained at a vacuum of about $10^{-3}$ torr and at a temperature within the range of 150° C.–200° C. until a PVDF solution is obtained having about 70% of PVDF and 30% of tricresylphosphate. This thick solution was then introduced into a liquid reservoir of a gear pump-driven dispensing device. This dispensing device, along with the object-building zone, are enclosed in a chamber which was ventilated continuously by a vacuum pump. The dispensing device and a supporting platform are driven to move in X-, Y-, and Z-directions according to a predetermined path. After a film of PVDF solution was deposited, the film was subjected to poling under a high electric field strength of 250 KV/cm at 70° C. for about 30 minutes, at which point the field was linearly increased to 500 KV/cm at poling time of about 2 hours, while maintaining the temperature at 80° C. The temperature is then lowered to room temperature. When room temperature was reached, the electric field was reduced to zero. The polarized material shows the following properties: $d_{31}=12$ pC/N, $d_{33}=30$ pC/N, $e_{31}=9.5$ mc/m$^2$, $p_y=22.5$ uC/m$^2$K, and dielectric constant=31.

Another example involves deposition and poling of a Nylon-11 material. A solution of 20% by weight of Nylon-11 and 80% of 2-ethyl-hexane-1,3 diol was prepared at 150° C. The solution was transferred to a vacuum oven, which was maintained at a vacuum of about $10^{-3}$ torr and at a temperature of 60° C. until the solution was thickened to become approximately 60% of Nylon-11. An inkjet printhead was used to deposit a thin layer of Nylon-11 onto a metal-coated glass slide. An electric field of 350 KV/cm was applied to pole the film at 25° C. for 20 minutes while the chamber was subjected to a constant pumping action to remove a majority of the solvent. The field was then switched off to obtain a plolarized film.

Process Details and Needed Hardware:

The process involves intermittently or continuously dispensing a fluent material composition (e.g., a PVDF-solvent solution) through an orifice 40 of a dispensing head 38 to deposit onto a target surface 44 of a support member. During this dispensing procedure, the target surface and the dispensing head are moved (preferably under the control of a computer 50 and a controller/indexer 54) with respect to each other along selected directions in a predetermined pattern on an X-Y plane defined by first (X-) and second (Y-) directions and along the Z-direction perpendicular to the X-Y plane. The three mutually orthogonal X-, Y- and Z-directions form a Cartesian coordinate system. These relative movements are effected so that the material composition can be deposited essentially point by point and layer by layer to build a single-layer or multiple-layer object according to a computer-aided design (CAD) drawing 56 of a 3-D object.

In one preferred embodiment, an optional heating provision (e.g., heating elements) is attached to, or contained in, the dispensing head to control the physical and chemical state of the material composition; e.g., to help maintain it in a fluent state. A temperature sensing means (e.g. a thermocouple) and a temperature controller can be employed to regulate the temperature of the dispensing head and the deposition chamber 18. Heating means are well known in the art.

As indicated earlier, the dispensing head may be advantageously designed to comprise a plurality of discharge orifices. Several commercial sources provide inkjet printheads that contain from several hundred to more than 1,500 discharge orifices. In another embodiment of the presently invented method, the dispensing head may comprise a plurality of inkjet print heads, each comprising a single orifice or a plurality of discharge orifices. Such a multiple-printhead dispensing system is desirable because an operator may choose to use different material compositions to build different portions of an object or device. Different material compositions could include different electronically responsive materials or simply just inert packaging materials such as epoxy or polyimide resins.

Referring again to FIG. 1, the target surface 44 is located in close, working proximity to (at a predetermined initial distance from) the dispensing head 38. The target surface preferably has a flat region sufficiently large to accommodate the first few layers of deposited material composition. An electrode 45 may be embedded in the target surface for use in poling. The target surface and the dispensing head are equipped with mechanical drive means for moving the target surface relative to the movable dispensing head in three dimensions along "X," "Y," and "Z" axes in a predetermined sequence and pattern, and for displacing the dispensing head a predetermined incremental distance relative to the target surface. This can be accomplished, for instance, by allowing the target surface and the dispensing head to be driven by three separate linear motion devices, which are powered by three stepper motors. Linear motion devices and X-Y-Z gantry tables are commercially available. Z-axis movements are effected to displace the nozzle relative to the support member and, hence, relative to each layer deposited prior to the start of the formation of each successive layer. This will make it possible to form multiple layers of predetermined thicknesses, which build up on each other sequentially as the material composition solidifies after being discharged from the orifice. Instead of stepper motors, many other types of drive means can be used, including linear motors, servo motors, synchronous motors, D.C. motors, and fluid motors.

Computer-Aided Design and Process Control:

A preferred embodiment of the present invention is an improved solid freeform fabrication method, which begins with the creation of a model (e.g., via computer-aided design, CAD), which is a data representation of a 3-D object (or device). This model is stored as a set of numerical representations of layers which, together, represent the whole object. A series of data packages, each data package corresponding to the physical dimensions, shape and material compositions of an individual layer, is stored in the memory of a computer in a logical sequence.

In one preferred approach, before the constituent layers of a 3-D object are formed, the geometry of this object is logically divided into a sequence of mutually adjacent theoretical layers, with each theoretical layer defined by a thickness and a set of closed, nonintersecting curves lying in a smooth two-dimensional (2-D) surface. These theoretical layers, which exist only as data packages in the memory of the computer, are referred to as "logical layers." This set of curves forms the "contour" of a logical layer or "cross section". In the simplest situation, each 2-D logical layer is a plane so that each layer is flat, and the thickness is the same throughout any particular layer. However, this is not necessarily so in every case, as a layer may have any desired curvature and the thickness of a layer may be a function of position within its two-dimensional surface. The only constraint on the curvature and thickness function of the logical layers is that the sequence of layers must be logically adjacent. Therefore, in considering two layers that come one after the other in the sequence, the mutually abutting surfaces of the two layers must contact each other at every point, except at such points of one layer where the corresponding point of the other layer is void of material as specified in the object model.

The closed, nonintersecting curves that are part of the representation of each layer unambiguously divide a smooth two-dimensional surface into two distinct regions. In the present context, a "region" does not mean a single, connected area. Each region may consist of several island-like subregions that do not touch each other. One of these regions is the intersection of the surface with the desired 3-D object, and is called the "positive region" of the layer. The other region is the portion of the surface that does not intersect the desired object, and is called the "negative region." The curves that demarcate the boundary between the positive and negative regions, and are called the "outline" of the layer. In the present context, various material compositions (including a polarized material) are allowed to be deposited in the "positive region" while, optionally, an electrically insulating material (e.g., epoxy or polyimide resin) may be deposited in certain parts or all of the "negative region" in each layer to serve as a support structure.

In one alternative embodiment of the present invention, the method involves depositing a lower-melting material in all of the negative regions in each layer to serve as a support structure. This support structure may be removed at a later stage or at the conclusion of the object-building process. The presence of a support structure (occupying the negative region of a layer), along with the object-building material (the positive region), will completely cover a layer before proceeding to build a subsequent layer.

As a specific example, the geometry of a three-dimensional object may be converted into a proper format utilizing commercially available CAD software. A commonly used format in solid freeform fabrication is the stereo lithography file (.STL), which has become a de facto industry standard for rapid prototyping. Another useful data format is the virtual reality modeling language (VRML) that contains not only geometry but also material composition data. The object image data may be sectioned into multiple layers by a commercially available software program. Each layer has its own shapes, dimensions, and material composition distributions which define both the positive region and the negative region. These layers, each being composed of a plurality of segments or data points, when combined together, will reproduce the intended object.

When a multi-material object is desired, these segments are preferably sorted in accordance with their material compositions. This can be accomplished by taking the following procedure: When the stereo lithography (.STL) format is utilized, the geometry is represented by a large number of triangular facets that are connected to simulate the exterior and interior surfaces of the object. The triangles may be so chosen that each triangle covers one and only one material composition. In a conventional .STL file, each triangular facet is represented by three vertex points each having three coordinate points, $(x_1,y_1,z_1)$, $(x_2,y_2,z_2)$ and $(x_3,y_3,z_3)$, and a unit normal vector $(i,j,k)$. Each facet is now further endowed with a material composition code to specify the desired material composition. This geometry representation of the object is then sliced into a desired number of layers expressed in terms of any desired layer interface format (such as Common Layer Interface or CLI format). During the slicing step, neighboring data points with the same material composition code on the same layer may be sorted together. These segment data in individual layers are then converted into programmed signals (data for selecting dispensing heads and tool paths) in a proper format, such as the standard NC G-codes commonly used in computerized numerical control (CNC) machinery industry. These layering data signals may be directed to a machine controller which selectively actuates the motors for moving the dispensing head with respect to the target surface, activates signal generators, drives the material supply means (if existing) for the dispensing head, drives the optional vacuum pump means, and operates optional temperature controllers, etc. It should be noted that although .STL file format has been emphasized in this paragraph, many other file formats have been employed in different commercial rapid prototyping and manufacturing systems. As indicated earlier, the VRML contains adequate information on the geometry and material distribution of a 3-D object. These file formats may be used in the presently invented system and each of the constituent segments or data points for the object geometry may be assigned a material composition code if an object of different material compositions at different portions is desired.

The three-dimensional motion controller is electronically linked to the mechanical drive means and is operative to actuate the mechanical drive means (e.g., those comprising stepper motors) in response to "X", "Y", "Z" axis drive signals for each layer received from the CAD computer. Controllers that are capable of driving linear motion devices are commonplace. Examples include those commonly used in a milling machine. Hence, this method may further comprise the steps of (1) creating a geometry of the object on a computer with the geometry including a plurality of segments or data points defining the object and materials to be used; and (2) generating program signals corresponding to each of these segments in a predetermined sequence, wherein the program signals determine the movement of the dispensing head and the target surface relative to one another in predetermined patterns.

At the conclusion of 3-D shape formation process, it is possible that some of the solvent still remains in the object. The present method may include additional steps of further removing a portion or a majority of the residual solvent ingredient after the object is constructed.

Figure 2A:
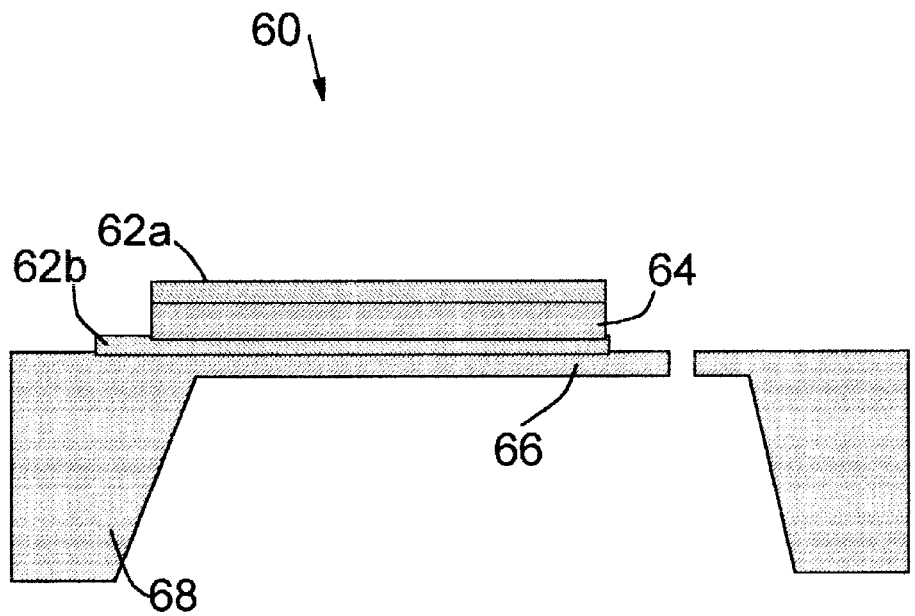
FIG. 2(a) is a schematic representation of a MEMS-based micro-actuator featuring a piezoelectric polymer film.

An example of a microelectromechanical system device 60, fabricated by using the presently invented direct write method, is schematically shown in FIG. 2a. This is a simple piezoelectric cantilever micro-actuator design. The piezoelectric polymer thin film 64, sandwiched between two electrodes 62a,62b, is placed on top of a non-polarizable polymer cantilever beam 66, which is integral with a bulk substrate 68. When a voltage is applied across the piezoelectric film, the film will expand or contract in the lateral direction, resulting a downward or upward deflection, respectively, of the cantilever 66. Piezoelectric films of this nature can be used to provide actuation in a variety of applications such as micro-valves, pumps, and positioning devices.

Figure 2B:
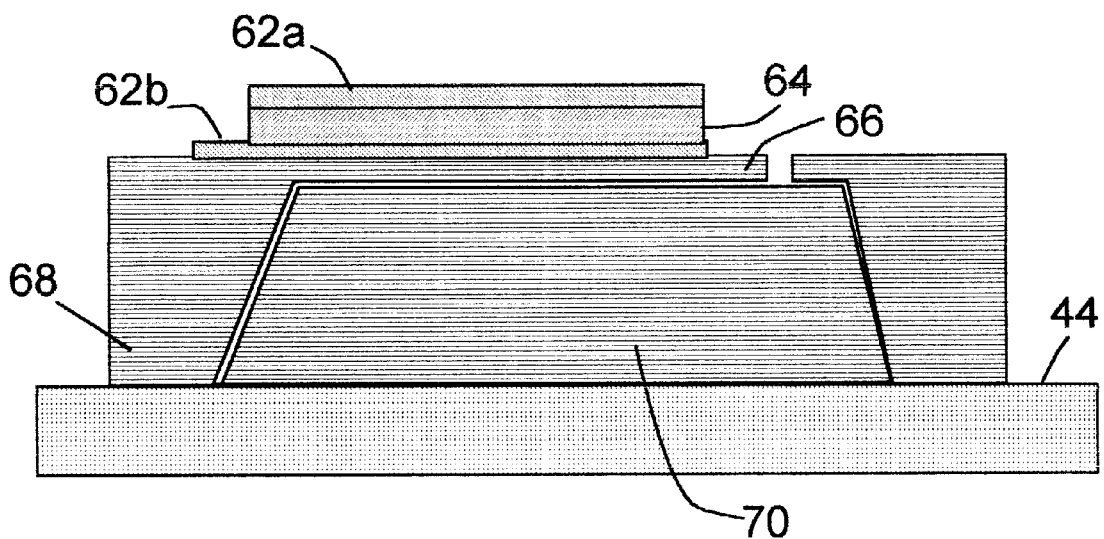
FIG. 2(b) shows the deposition procedures in which individual elements, including a support structure, were deposited point by point and layer by layer.

As illustrated in FIG. 2b, the proposed method began with the deposition of the non-polarizable polymer substrate 68 and a support structure 70 point by point and layer by layer onto a target surface 44. The substrate may be selected from the vinyl fluoride copolymers that have good mechanical, thermal, and chemical compatibility with those of the electrode and piezoelectric materials. Either a low melting polymer (e.g., wax) or a water soluble polymer may be used to make the support structure 70, which can be easily removed after the complete actuator is deposited. The electrode may be a conducting composite composed of metallic particles dispersed in a polymer matrix or a conducting conjugate polymer. The piezoelectric film in the present example was PVDF, which was deposited from a tricresylphosphate solution. Both the electrodes and the PVDF film were deposited point by point and layer by layer.

What is claimed is:

1. A direct-write method for depositing a polarized material onto a target surface, said method comprising the following steps:
   (1) forming a solution of a material capable of being polarized using a polarization solvent which can be removed by evaporation to provide a crystalline or amorphous polarized material which is substantially free of mechanically-induced orientation;
   (2) operating dispensing means to discharge and deposit said solution onto said target surface substantially point by point and at least partially removing said solvent from the deposited solution to form a thin layer of substantially solidified material of a predetermined pattern; and
   (3) during said solvent-removing step, subjecting the deposited solution to a DC electric field for poling until substantial polarization is attained to form said polarized material.

2. The method of claim 1 in which the material used is a polarizable amorphous material.

3. The method of claim 2 in which the amorphous material used is a poly (vinylidene cyanide/vinyl acetate) copolymer.

4. The method of claim 1 in which the material used is selected from the group consisting of poly (vinylidene fluoride), vinylidene fluoride copolymer, poly (vinylidene fluoride/trifluorethylene) copolymer, poly (vinylidene fluoride/tetrafluoroethylene) copolymer, and a mixture thereof.

5. The method of claim 1 in which the effective DC electric field used is provided by corona discharge.

6. The method of claim 1 wherein the polarized material is a soluble ceramic material or a polymer having polymer units capable of being polarized, selected from the group consisting of vinyl units, vinylidene units, ethylene units, acrylate units, methacrylate units, nylon units, carbonate units, acrylonitrile units, cellulose units, units having fluoro, chloro, amide, ester, cyanide, carbonate, nitrile or ether groups, protein units, and combinations thereof.

7. The method of claim 1 wherein said dispensing means comprising a device being selected from the group consisting of an inkjet printhead, liquid droplet generator, extrusion device, gear pump, air pressure pump, positive displacement pump, screw-driven pump, syringe pump, fused deposition modeling nozzle, and a combination thereof.

8. A freeform fabrication method for making a multiple-layer object featuring a polarizable material from a design created on a computer, comprising:
  (1) providing a target surface on which said object is supported while being constructed;
  (2) forming a solution of a material capable of being polarized using a polarization solvent which can be removed by evaporation to provide a polarized material;
  (3) operating dispensing means to discharge and deposit said solution onto said target surface substantially point by point and at least partially removing said solvent from the deposited solution to form a thin first layer of substantially solidified material of a predetermined first pattern, leaving behind a remaining region free from said polarizable material; during said solvent-removing step, subjecting the deposited solution to poling;
  (4) operating dispensing means to deposit at least a second material onto said remaining region of said first layer;
  (5) repeating steps (3) and (4) for building multiple layers of said object; and
  (6) operating control means for generating control signals in response to coordinates of said design of said object and for controlling the movement of said dispensing means relative to said target surface in response to said control signals to control dispensing of said solution and said at least a second material to construct said object while supported on said target surface.

9. The method of claim 8, wherein said solvent-removing step involving operating a device selected from the group consisting of a ventilation fan, a vacuum pump, a hot air blower, a heater, and a combination thereof.

10. The method of claim 8, wherein said control means including servo means for indexing and positioning said dispensing means relative to said target surface.

11. The method of claim 10, wherein said servo means provide indexing and positioning in at least two dimensions.

12. The method of claim 11, wherein said servo means provide indexing and positioning in a third dimension.

13. The method of claim 8, wherein said dispensing means comprising a plurality of inkjet print heads.

14. The method of claim 8, wherein said dispensing means comprising a plurality of nozzle orifices.

15. The method of claim 8 wherein said movement step comprising moving said dispensing means and said target surface relative to one another in a plane defined by first and second directions and in a third direction orthogonal to said plane to form said solution and said at least a second material into a multi-layer object.

16. The method of claim 15, wherein said movement step includes the steps of moving said dispensing means and said target surface relative to one another in a direction parallel to said plane to form a first layer of said solution and/or said at least a second material on said target surface with a portion of said solvent being removed immediately after said solution is dispensed, moving said dispensing means and said target surface away from one another in said third direction by a predetermined layer thickness distance, and dispensing a second layer of said solution and/or said at least a second material onto said first layer and removing a portion of said solvent from said solution while simultaneously moving said dispensing means and said target surface in said direction parallel to said plane, whereby said second layer adheres to said first layer.

17. The method of claim 16, further including the steps of forming multiple layers of said polarizable material and said at least a second material on top of one another by repeated dispensing of said solution and said at least a second material and at least partially removing said solvent in said dispensed solution as said dispensing means and said target surface are moved relative to one another in one direction parallel to said plane, with said dispensing means and said target surface being moved away from one another in said third direction by a predetermined layer thickness after each preceding layer has been formed.

18. The method of claim 17, further including the steps of:
  creating a geometry representation of said multiple-layer object on a computer, said geometry representation including a plurality of segments or data points defining said object;
  generating programmed signals corresponding to each of said segments or data points in a predetermined sequence; and
  moving said dispensing means and said target surface relative to one another in response to said programmed signals.

19. The method of claim 8, wherein said at least a second material comprising a material composition selected from the group consisting of a conductor, resistor, semiconductor, capacitor, inductor, superconductor, diode, transistor, light-emitting element, light-sensing element, solar cell element, sensor, actuator, semiconductor logic element, electro-optic logic element, spin material, magnetic material, thermo-electric element, electromagnetic wave emission, transmission or reception element, electronically addressable ink, and a combination thereof.

20. The method as set forth in claim 19 wherein said polarizable material and said at least a second material being deposited at discrete locations in three-dimensional object space to form a spatially controlled material composition object.

* * * * *